United States Patent
Maciejewski

(10) Patent No.: US 10,203,383 B2
(45) Date of Patent: Feb. 12, 2019

(54) MAGNETIC RESONANCE MAGNET UNIT HAVING A MAGNET HOUSING

(71) Applicant: Siemens Healthcare GmbH, Erlangen (DE)

(72) Inventor: Bernd Maciejewski, Markt Erlbach (DE)

(73) Assignee: Siemens Healthcare GmbH, Erlangen (DE)

( * ) Notice: Subject to any disclaimer, the term of this patent is extended or adjusted under 35 U.S.C. 154(b) by 232 days.

(21) Appl. No.: 15/248,251

(22) Filed: Aug. 26, 2016

(65) Prior Publication Data
US 2017/0059677 A1 Mar. 2, 2017

(30) Foreign Application Priority Data
Aug. 27, 2015 (DE) .................. 10 2015 216 423

(51) Int. Cl.
*G01R 33/3815* (2006.01)
*H01F 6/06* (2006.01)
*G01R 33/38* (2006.01)

(52) U.S. Cl.
CPC ..... *G01R 33/3815* (2013.01); *G01R 33/3802* (2013.01); *H01F 6/06* (2013.01)

(58) Field of Classification Search
CPC .......... G01R 33/20; G01V 3/32; A61B 5/055; G01N 24/00
USPC .................. 324/200, 300, 301, 307, 309
See application file for complete search history.

(56) References Cited

U.S. PATENT DOCUMENTS

| | | | |
|---|---|---|---|
| 9,991,716 B2 * | 6/2018 | Cutright | G05B 19/048 |
| 9,992,855 B2 * | 6/2018 | Larroux | H05G 1/58 |
| 2007/0257042 A1 | 11/2007 | Gore et al. | |
| 2009/0044212 A1 | 2/2009 | Dietz et al. | |
| 2012/0075045 A1 | 3/2012 | Calvert | |
| 2017/0319097 A1 * | 11/2017 | Amthor | A61B 5/055 |

* cited by examiner

*Primary Examiner* — Giovanni Astacio-Oquendo
(74) *Attorney, Agent, or Firm* — Schiff Hardin LLP

(57) ABSTRACT

A magnet unit for a magnetic resonance apparatus has a superconducting basic field magnet, a vacuum vessel, within which the superconducting basic field magnet is situated, and a cylindrical magnet housing. The magnet housing has a housing surface having a first sub-area and a second sub-area, with the first sub-area inwardly offset from the outside, in the direction of a longitudinal extent of the magnet unit, in relation to the second sub-area.

8 Claims, 3 Drawing Sheets

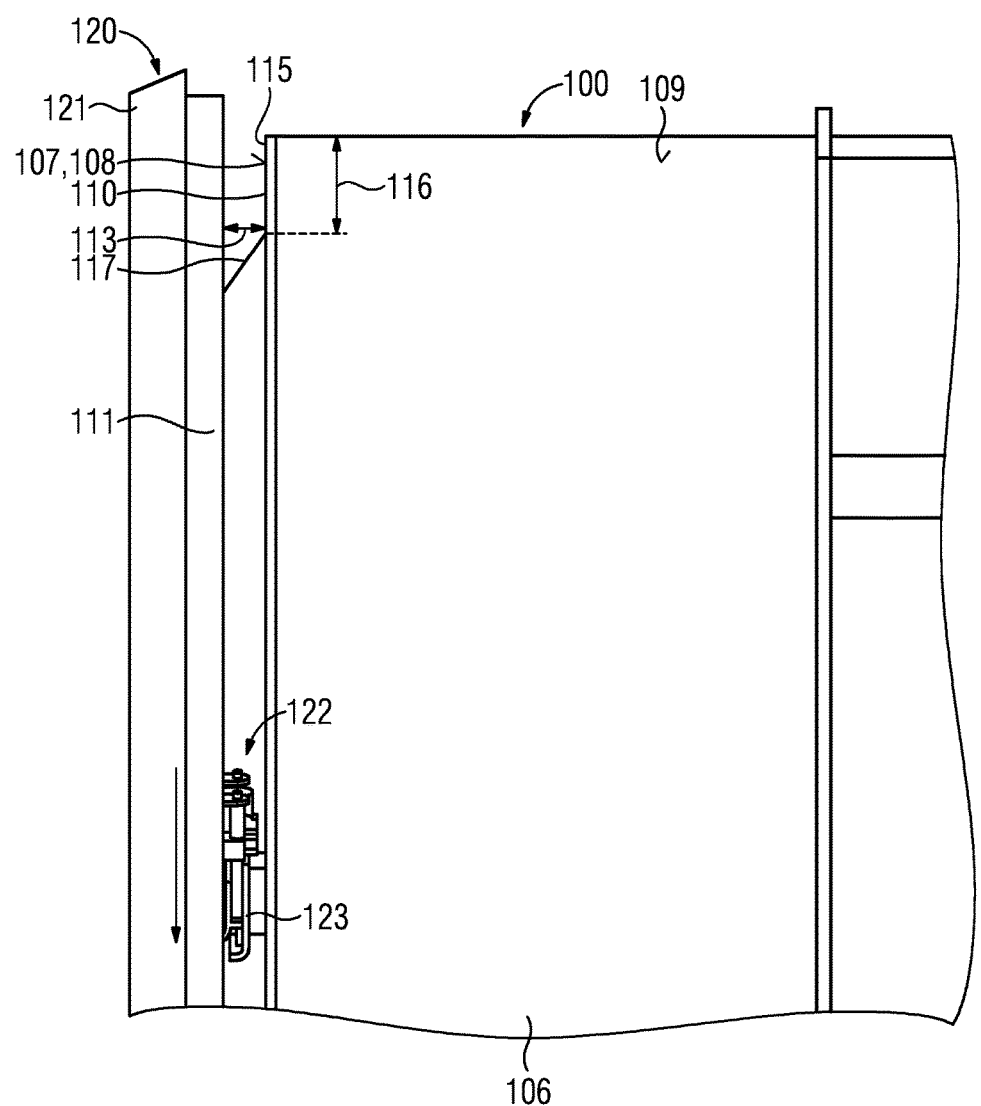

MAGNETIC RESONANCE MAGNET UNIT HAVING A MAGNET HOUSING

BACKGROUND OF THE INVENTION

Field of the Invention

The present invention concerns a magnet unit (also called a scanner) for a magnetic resonance apparatus, wherein the magnet unit has a superconducting basic field magnet, a vacuum vessel, within which the superconducting basic magnet is situated, and a cylindrical magnet housing.

Description of the Prior Art

For conventional magnetic resonance apparatuses, a housing cladding is fastened and/or suspended on the magnet unit, in particular on a magnet housing of the magnet unit, so the magnet housing outwardly shields and/or surrounds a superconducting basic field magnet of the magnet unit. The fastening and/or suspension of the housing cladding should be as close as possible to the outer edge of the magnet housing, in order to minimize the transmission of vibrations and/or sound waves from the magnet unit to the housing cladding. However, the fastening should not take place actually on the outer edge of the magnet housing, since vibration exaggerations may occur there.

SUMMARY OF THE INVENTION

An object of the present invention is to provide a magnet unit of the above type that allows for simple assembly of the housing.

In accordance with the invention, a magnet unit for a magnetic resonance apparatus has a superconducting basic field magnet, a vacuum vessel, within which the superconducting basic field magnet is situated, and a cylindrical magnet housing, and the magnet housing has a housing surface that has a first sub-area and a second sub-area and, in the direction of a longitudinal extent of the magnet unit, the first sub-area is inwardly offset from the exterior, in relation to the second sub-area.

In this context, a superconducting basic field magnet means a superconducting magnet with superconducting magnet coils, which is designed to generate a constant basic magnetic field in a magnetic resonance apparatus. A basic magnetic field of at least 1.5 Tesla, and preferably of at least 3 Tesla, is generated by the superconducting basic field magnet. The superconducting basic field magnet is arranged within the vacuum vessel at a temperature of approx. 4 Kelvin, wherein the vacuum vessel is situated within a space enclosed by the magnet housing.

The magnet unit is preferably cylindrical and/or drum-shaped, and in its interior the magnet unit has a cylindrical receiving area that extends therethrough along the longitudinal extent of the magnet unit. The receiving area is designed to receive gradient coil components, radio-frequency antenna components and/or the patient for a magnetic resonance examination. An outer sleeve of the cylindrical and/or drum-shaped magnet unit is formed by the cylindrical magnet housing.

The direction of a longitudinal extent means the direction of the length and/or the height of the cylinder casing of the cylindrical magnet unit.

The design of the invention provides for an additional installation space, which can be used particularly advantageously for attaching, in particular fastening and/or suspending, at least one housing shell of the magnetic resonance apparatus on the magnet housing. Fastening elements of this type for fastening the at least one housing shell can be arranged in a space-saving manner on the magnet unit, in particular on the first sub-area of the magnet housing. This permits simple assembly of the housing on the magnet unit, in particular on the magnet housing.

Furthermore, the housing surface with the first sub-area and the second sub-area is situated on a front surface of the magnet housing. A front surface of the magnet housing means a surface on a front side or on a rear side of the magnet housing. The front side and/or the rear side preferably has a circular base surface of the cylindrical magnetic resonance housing. The front surface is preferably arranged on a surface of the magnet housing, which is aligned substantially at right angles to the longitudinal extent of the magnet unit. Moreover, the front surface is situated on an end area of the magnet unit. With the embodiment of the front surfaces with the first sub-area and the second sub-area of the housing surface and the installation space thus additionally available, an advantageous arrangement and/or fastening of further units, for instance assembly units and/or housing shell units, directly on the front surface can take place. This also permits a simpler tolerance compensation within the assembly units than is usual in existing systems, with which the assembly units are arranged on a cylindrical housing surface of the magnet unit, because a conversion of movements on the cylindrical housing surface into movements in the horizontal and/or vertical direction on the front surface would first be necessary.

This allows for an advantageous attachment of a heavy front cladding and/or heavy rear cladding of a housing of the magnetic resonance apparatus on the magnet housing. In particular, a support surface for at least one fastening element on the first sub-area is arranged substantially in parallel with the force of gravity acting on the magnet unit. This permits the heavy front cladding and/or heavy rear cladding to be suspended and/or fastened at a minimal distance from the center of gravity of the front cladding and/or the rear cladding. Suspension and/or fastening on a cylinder casing surface of the cylindrical magnet housing thus can be dispensed with.

Furthermore, the unwanted influence of weld seams, in particular a deformation of the magnet housing by the weld seams that are present on the cylinder casing surface of the cylindrical magnet housing, can be minimized with the suspension and/or fastening of housing shells on the magnet unit. Furthermore, the influence of welded rings, which are welded to the cylinder casing surface of the cylindrical magnet housing, also can be minimized with the suspension and/or fastening of housing shells on the magnet unit.

The fastening on the magnet unit can take place in a particularly compact manner on the first sub-area, so that the entire installation length of the magnetic resonance apparatus can be made compactly. The use of smaller end plates for the magnet housing, and thus a simple and cost-effective manufacture of the magnet unit, is also possible.

In a further embodiment of the invention, the first sub-area is situated on an outer edge area of the front surface in the radial direction. In this way an advantageous decoupling between the housing which can be attached and/or fastened on the magnet housing, and the magnet unit can be achieved, and thus an unwanted transmission of sound waves and/or vibrations from the magnet unit to the housing can be reduced.

Particularly advantageously the first sub-area is situated circumferentially on the front surface. This permits a flexible attachment of fastening units on the first sub-area. The attachment of fastening units and/or fastening elements to fasten housing shells of a housing on the magnet housing, in particular on the first sub-area of the magnet housing, can take place at different and/or any positions within the first sub-area. Circumferential as used herein means that the first sub-area is arranged in an annular manner around the second sub-area, so the first sub-area comprises a closed ring.

The distance of the first sub-area from the second sub-area due to the arrangement of the first sub-area so as to be inwardly offset in the direction of the longitudinal extent of the magnet unit in relation to the second sub-area, is particularly advantageous as a function of the design and/or type of construction of the magnet unit, in particular the superconducting basic field magnet of the magnet unit. Particularly advantageously the first sub-area is inwardly offset by at least 10 mm and at most 60 mm in the direction of the longitudinal extent of the magnet unit in relation to the second sub-area.

The first sub-area is, by increments in terms of preferability, inwardly offset by at least 15 mm and at most 55 mm, by at least 20 mm and at most 50 mm, by at least 25 mm and at most 45 mm, by at least 30 mm and at most 40 mm, and by approx. 36 mm in the direction of the longitudinal extent of the magnet unit in relation to the second sub-area.

The width of the first sub-area in the radial direction is dependent on the design and/or type of construction of the magnet unit, in particular the superconducting basic field magnet of the magnet unit. The first sub-area in the radial direction has a width, by increments in terms of preferability that is greater than 60 mm and less than 140 mm, greater than 70 mm and less than 130 mm, greater than 80 mm and less than 120 mm, particularly advantageously greater than 90 mm and less than 110 mm. The width of the first sub-area particularly preferably amounts to approx. 102 mm in the radial direction.

In a further embodiment of the invention, the magnet housing has a connecting area, which is arranged between the first sub-area and the second sub-area, wherein the first sub-area forms an angle of greater than 90° with the connecting area. This provides for a more advantageous and stable transition between the first sub-area and the second sub-area.

Furthermore, the invention concerns a magnetic resonance apparatus with a magnet unit for a magnetic resonance apparatus, wherein the magnet unit has a superconducting basic field magnet, a vacuum vessel, within which the superconducting basic field magnet is situated, and a cylindrical magnet housing. The magnet housing has a housing surface that has a first sub-area and a second sub-area and, in the direction of a longitudinal extent of the magnet unit, the first sub-area is inwardly offset from the exterior in relation to the second sub-area.

The design of the invention provides for additional installation space, which can be used particularly advantageously for attaching, in particular fastening and/or suspending, at least one housing shell of a magnetic resonance apparatus on the magnet housing. In particular, fastening elements of this type for fastening the at least one housing shell can be arranged in a particularly space-saving manner on the magnet unit, in particular on the first sub-area of the magnet housing. This permits simple assembly of the housing on the magnet unit, in particular on the magnet housing.

The advantages of the inventive magnetic resonance apparatus essentially correspond to the advantages of the inventive magnet unit, which are explained above in detail. Features, advantages or alternative embodiments mentioned above are applicable to the other aspects of the invention.

In a further embodiment of the invention, the magnetic resonance apparatus has a housing with a housing shell and a fastening unit for fastening the housing shell on the magnet housing, wherein the fastening unit is arranged on the first sub-area of the magnet housing. An advantageous attachment, such as fastening and/or suspension, of a heavy housing shell of the front cladding and/or a heavy housing shell of the rear cladding on the magnet unit, in particular the magnet housing, can be achieved in this way. A support surface for at least one fastening element on the first sub-area is situated substantially in parallel with the force of gravity acting on the magnet unit. This permits the heavy front cladding and/or heavy rear cladding to be suspended and/or fastened at a minimal distance from the center of gravity of the front cladding and/or the rear cladding. A suspension and/or fastening on a cylinder casing surface of the cylindrical magnet housing thus can be dispensed with.

Furthermore, the unwanted influence of weld seams, which are present on the cylinder casing surface of the cylindrical magnet housing, can be advantageously minimized with the suspension and/or fastening of housing shells on the magnet unit. Furthermore, the influence of welded rings, which are welded to the cylinder casing surface of the cylindrical magnet housing, can also be advantageously minimized with the suspension and/or fastening of housing shells on the magnet unit.

The fastening on the magnet unit can take place in a particularly compact manner on the first sub-area, so that the entire installation length of a magnetic resonance apparatus can be made compact.

BRIEF DESCRIPTION OF THE DRAWINGS

FIG. 3 schematically shows the magnet unit together with a housing shell on the magnet unit.

DESCRIPTION OF THE PREFERRED EMBODIMENTS

Figure 1:
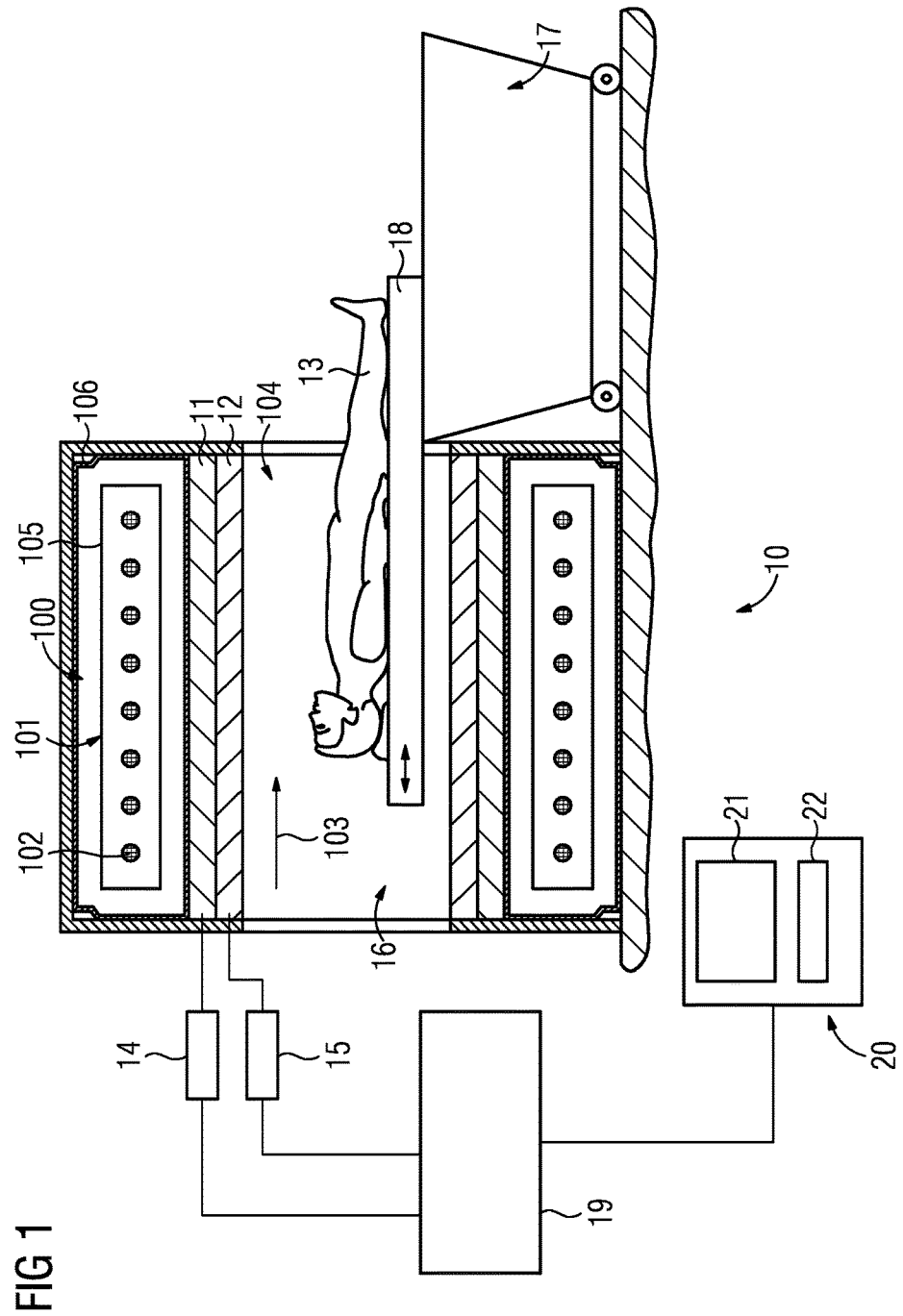
FIG. 1 schematically illustrates a magnetic resonance apparatus according to the invention.

FIG. 1 schematically illustrates a magnetic resonance apparatus 10. The magnetic resonance apparatus 10 has a magnet unit 100 that has a superconducting basic field magnet 101. The superconducting basic field magnet 101 has a superconducting basic field magnet coil 102 or a number of superconducting basic field magnet coils 102 to generate a strong and constant basic magnetic field 103. For clarity in FIG. 1, the superconducting basic field magnet 101 is shown as an example with only one superconducting basic field magnet coil 102. The magnet unit 101 is cylindrical and/or drum-shaped and in its interior has a cylindrical receiving area 104 for receiving gradient coil components 11, radio-frequency antenna components 12 and the patient 13 during a magnetic resonance examination. For operation of the magnetic resonance apparatus 10, it is necessary for the one superconducting basic field magnet coil 101 or the number of superconducting basic field magnet coils 101 to be cooled to a temperature of approx. −270° C. using a cooling fluid formed by liquid helium. To this end the superconducting basic field magnet 101 is situated within a vacuum vessel 104 of the magnet unit 100.

The superconducting basic field magnet 101 is designed cylindrically and/or drum-shaped together with the vacuum vessel 105, so that in the interior the superconducting basic field magnet 101 and also the vacuum vessel 105, the cylindrical receiving area 104 is present for receiving gradient coil components 11, radio-frequency antenna components 12 and/or the patient 13 during a magnetic resonance examination.

Furthermore, the magnet unit 100 has a magnet housing 106, which is arranged around the superconducting basic field magnet 101 and around the vacuum vessel 105. The magnet housing 106 is likewise cylindrical and/or in a drum shape around the superconducting basic field magnet 101 and about the vacuum vessel 105 and also has the cylindrical receiving area 104 in its interior.

In addition to the magnet unit 101, the magnetic resonance apparatus 10 has the gradient coil components 11 for generating magnetic field gradients that are used for spatial encoding during imaging. The gradient coil components 11 are controlled by a gradient control processor 14 of the magnetic resonance apparatus 10. The magnetic resonance apparatus 10 furthermore has the radio-frequency antenna components 12 that is controlled by a radio-frequency antenna control processor 15 of the magnetic resonance apparatus 10 so as to radiate a radio-frequency sequence into an examination space that is substantially formed by the patient receiving area 16 of the magnetic resonance apparatus 10. The radiated radio-frequency sequence excites certain nuclear spins in the patient 13, so as to give the excited nuclear spins a magnetization that deviates from the polarization produced by the field lines of the basic magnetic field. As these excited nuclear spins relax, they emit magnetic resonance signals (which are also radio-frequency signals). The radio-frequency antenna components 12 can include one antenna component that both transmits and receives such radio-frequency signals, or different antenna components that individually transmit radio-frequency signals, or receive radio-frequency signals, respectively. The gradient coil components 11 and the radio-frequency antenna components 12 are situated within the receiving area 104 of the magnet unit 100.

The patient receiving area 16 is designed to receive the patient 13. The patient receiving area 16 is designed cylindrically and is cylindrically surrounded in a peripheral direction by the magnet unit 100, the gradient coil components 11 and the radio-frequency antenna components 12. The patient 13 can be moved of a patient support apparatus 17 of the magnetic resonance apparatus 10 into the patient receiving area 16. For this purpose the patient support apparatus 17 has a patient bed 18 that is configured to be movable within the patient receiving area 16.

For controlling the basic field magnet 101, the gradient control processor 14 and for controlling the radio-frequency antenna control processor 15, the magnetic resonance apparatus 10 has a system control computer 19. The system control computer 19 centrally controls the magnetic resonance apparatus 10, such as, for example, the execution of a predetermined imaging gradient echo sequence. Moreover, the system control computer 19 includes an evaluation unit (not shown) for evaluating medical image data that are acquired during the magnetic resonance examination.

Furthermore, the magnetic resonance apparatus 10 has a user interface 20, which is connected to the system control computer 19. Control information such as imaging parameters, for example, as well as reconstructed magnetic resonance images can be displayed on a display unit 21, for example on at least one monitor, of the user interface 20 for a medical operator. Furthermore, the user interface 20 has an input unit 22 by means of which information and/or parameters can be entered by the medical operator during a measuring process.

Figure 2:
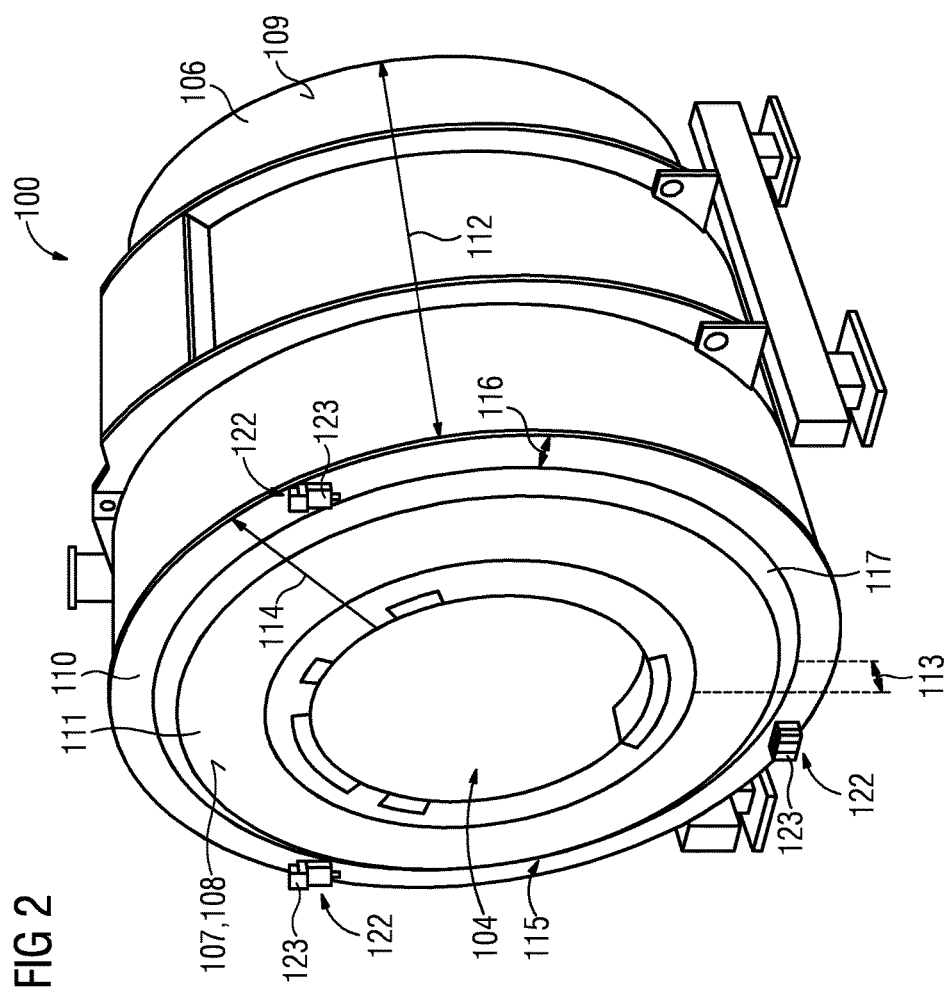
FIG. 2 schematically illustrates an inventive magnet unit.

FIG. 2 shows a perspective front view of the magnet unit 100, in particular of the magnet housing 106. The magnet housing 106 comprises housing surfaces 108 formed by circular front surfaces 107 and housing surfaces 109 formed by cylinder casing-shaped surfaces. The front surfaces 107, particularly on a front face and a rear face, each has a first sub-area 110 and a second sub-area 111. As an example in FIG. 2, only the front surface of the magnet unit 100 is visible, wherein the embodiment of the rear surface is shown analogously to the embodiment of the front surface.

In the direction of the longitudinal extent 112 of the magnet unit 100, the first sub-area 110 is arranged inwardly offset from the outside inwards in relation to the second sub-area 111.

The distance 113 of the first sub-area 110 from the second sub-area 111 in the direction of the longitudinal extent 112, due to the inwardly offset arrangement of the first sub-area 110 in the direction of the longitudinal extent 112 in relation to the second sub-area 111, is particularly advantageous as a function of the design and/or type of construction of the magnet unit 100, in particular the superconducting basic field magnet 101. The first sub-area 110 is inwardly offset by at least 10 mm and at most 60 mm in the direction of the longitudinal extent 112 in relation to the second sub-area 111.

The first sub-area 110 is inwardly offset in the direction of the longitudinal extent 112, by increments in terms of preferability, by at least 15 mm and at most 55 mm, by at least 20 mm and at most 50 mm, by at least 25 mm and at most 45 mm, by at least 30 mm, and at most 40 mm and particularly preferably by approx. 36 mm in relation to the second sub-area 111.

The first sub-area 110 on an outer edge area 115 of the front surface 107 in the radial direction 114 is situated on the front surfaces 107, in particular the front face or the rear face. Thus the outer edge area 115 in the radial direction 114 is inwardly offset in the direction of the longitudinal extent 112 and the inner second sub-area 111 in the radial direction 114 projects forwards from the outer edge area 115. The first sub-area 110 and the second sub-area 111 extend in the radial direction on the front surface 107, in particular the front face or the rear face. The first sub-area 110 is situated circumferentially on the front surface 107 of the magnet housing 106 so that in relation to the second sub-area 111 in the direction of the longitudinal extent 112 the first sub-area 110 has an inwardly offset closed ring.

The width 116 of the first sub-area 110 in the radial direction 114 is dependent on the design and/or type of construction of the magnet unit 100, in particular the superconducting basic field magnet 101. The width 116 of the first sub-area 110, in particular an annular width of the first sub-area 110, on the front surface 107 of the magnet housing 106 is greater here than 60 mm and less than 140 mm, and in incremental terms of preferability is greater than 70 mm and less than 130 mm, greater than 80 mm and less than 120 mm, and greater than 90 mm and less than 120 mm. Preferably the width 116 of the first sub-area 110, in particular an annular width of the first sub-area 110, on the front surface 107 of the magnet housing 106 is approx. 102 mm.

The magnet unit 100, namely the magnet housing 106 thereof, has a connecting area 117, which is likewise situated on the front surface 107, between the first sub-area 110 and the second sub-area 111. The first sub-area 110 makes an angle of greater than 90° with the connecting area 117. The connecting area 117 likewise proceeds circumferentially around the second sub-area 111. The connecting area 117 thus has a conical annular surface that tapers from the inside outwardly in the longitudinal extent 112 of the magnet unit 100.

In FIG. 3, the magnet unit 100 is shown together with a housing 120, namely the housing shell 121 of the housing 120, of the magnetic resonance apparatus 10. The housing shell 121 is situated on the front surface of the magnet housing 106. To support or suspend or fasten the housing shell 121 on the front surface of the magnet housing 106, the housing 120 also has a fastening components 122. The fastening components 122 as shown has three fastening elements 123, on the first sub-area 110 of the magnet housing 106 (FIGS. 2 and 3).

A support surface for the three fastening elements 123 on the first sub-area 110 is essentially parallel to the force of gravity acting on the magnet unit 100. This allows for a suspension and/or fastening of the housing shell 121, in particular a front cladding and/or a rear cladding, at a minimal distance from the center of gravity of the front cladding and/or the rear cladding. In an alternative embodiment of the invention, the number of fastening elements 123 can be more than three fastening elements 123. The number of fastening elements 123 is dependent on the weight and/or weight distribution of the housing shell 121.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnet unit for a magnetic resonance apparatus, said magnet unit comprising:
    a superconducting basic field magnet;
    a vacuum vessel in which the superconducting basic field magnet is situated;
    a cylindrical magnet housing that at least partially encases said magnet unit; and
    said magnet housing comprising a housing surface having a first sub-area and a second sub-area, said first sub-area being inwardly offset from an exterior of said magnet housing in a direction of a longitudinal extent of said magnet unit, in relation to said second sub-area.

2. The magnet unit as claimed in claim 1 wherein said housing surface is situated on a front surface of said magnet housing.

3. The magnet unit as claimed in claim 2 wherein said first sub-area is situated on an outer edge area of said front surface in a radial direction.

4. The magnet unit as claimed in claim 2 wherein said first sub-area is situated circumferentially on said front surface.

5. The magnet unit as claimed in claim 1 wherein said first sub-area is inwardly offset by at least 15 mm and at most 55 mm in said direction of said longitudinal extent of said magnet unit, in relation to said second sub-area.

6. The magnet unit as claimed in claim 1 wherein said sub-area has a width in radial direction that is greater than 60 mm and less 140 mm.

7. The magnet unit as claimed in claim 1 wherein said magnet housing comprises a connecting area between said first sub-area between said first sub-area and said second sub-area, said first sub-area making an angle of greater than 90° with said connecting area.

8. A magnetic resonance apparatus comprising:
    a magnetic resonance data acquisition scanner configured to operate to acquire magnetic resonance data from a subject;
    said magnetic resonance data acquisition scanner comprising a magnet unit; and
    said magnet unit comprising a superconducting basic field magnet, a vacuum vessel in which the superconducting basic field magnet is situated, a cylindrical magnet housing that at least partially encases said magnet unit, and said magnet housing comprising a housing surface having a first sub-area and a second sub-area, said first sub-area being inwardly offset from an exterior of said magnet housing in a direction of a longitudinal extent of said magnet unit, in relation to said second sub-area.

* * * * *